US011728398B2

(12) United States Patent
Shur et al.

(10) Patent No.: US 11,728,398 B2
(45) Date of Patent: Aug. 15, 2023

(54) DEVICE AND METHOD FOR MANAGING ELECTROMAGNETIC RADIATION

(71) Applicant: The Government of the United States of America, as represented by the Secretary of the Navy, Arlington, VA (US)

(72) Inventors: Michael Shur, Vienna, VA (US); David J. Meyer, Fairfax, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/928,243

(22) Filed: Jul. 14, 2020

(65) Prior Publication Data
US 2021/0057534 A1   Feb. 25, 2021

Related U.S. Application Data

(60) Provisional application No. 62/890,627, filed on Aug. 23, 2019.

(51) Int. Cl.
*H01L 27/146*   (2006.01)
*H01L 29/423*   (2006.01)
(Continued)

(52) U.S. Cl.
CPC ...... *H01L 29/42328* (2013.01); *H01L 23/552* (2013.01); *H01L 27/14649* (2013.01);
(Continued)

(58) Field of Classification Search
CPC ......... H01L 29/42328; H01L 27/14649; H01L 29/788; H01L 29/66825; H01L 27/14658;
(Continued)

(56) References Cited

U.S. PATENT DOCUMENTS 5,309,007 A    5/1994  Kelner et al.
5,905,273 A *  5/1999  Hase .................. B82Y 10/00
                                                       257/192
(Continued)

OTHER PUBLICATIONS

M. Shur, Terahertz Sensing Technology, Special issue of the International Journal of High-Speed Electronics, and Systems, vol. 24, Nos. 1 & 2 (2015).
(Continued)

*Primary Examiner* — David Vu
(74) *Attorney, Agent, or Firm* — US Naval Research Laboratory; Nigel R. Fontenot

(57) ABSTRACT

Semiconductor devices having conductive floating gates superimposed on and/or embedded within a conducting channel for managing electromagnetic radiation in the device. The conductive floating gates can comprise a one- or two-dimensional array of asymmetric structures superimposed on and/or embedded within the conducting channel. The conductive floating gates can comprise $Nb_2N$, $Ta_2N$, $TaN_x$, $NbN_x$, $WN_x$, or $MoN_x$ or any transition metal nitride compound. The device can include a plurality of conductive floating gates on a rear surface of a barrier layer, wherein each of the conductive floating gates might be separately biased for individual tuning. Antennas for capturing or emitting THz or sub-THz radiation could be attached to the device contacts. Terahertz or infrared radiation could be manipulated by driving a current through the conducting channel into a plasmonic boom regime. Additional manipulation of the electromagnetic radiation could be achieved by having antennas with an appropriate phase angle shift.

20 Claims, 16 Drawing Sheets

(51) Int. Cl.
  *H01L 29/788* (2006.01)
  *H01L 29/66* (2006.01)
  *H01L 23/552* (2006.01)
(52) U.S. Cl.
  CPC .. *H01L 27/14658* (2013.01); *H01L 27/14689* (2013.01); *H01L 29/66825* (2013.01); *H01L 29/788* (2013.01)
(58) Field of Classification Search
  CPC . H01L 27/14689; H01L 23/552; H01L 23/66; G01N 21/3581; A61B 5/0507
  See application file for complete search history.

(56) References Cited

U.S. PATENT DOCUMENTS

| | | | | |
|---|---|---|---|---|
| 6,720,589 | B1* | 4/2004 | Shields | B82Y 10/00 257/14 |
| 7,638,817 | B2 | 12/2009 | Shur et al. | |
| 2017/0206461 | A1* | 7/2017 | Friesen | G06F 15/82 |
| 2018/0175241 | A1* | 6/2018 | Jain | B82Y 10/00 |

OTHER PUBLICATIONS

R. A. Lewis, "A review of terahertz sources," J. Phys. D: Appl. Phys. 47 (2014).
L. Gelmont and M. S. Shur, "High-Field Domains in the Presence of Electron-Hole Pairs," Phys. Lett. vol. 36A, No. 4, pp. 305-307 (1971).
S. N. Vainshtein, V. S. Yuferev, and J. T. Kostamovaara, "Ultrahigh field multiple Gunn domains as the physical reason for superfast (picosecond range) switching of a bipolar GaAs transistor," Appl. Phys. 97, 024502 (2005).
E. Y. Seok et al., "410-GHz CMOS Push-push Oscillator with a Patch Antenna," 2008 International Solid-State Circuits Conference, pp. 472-473 (2008).
C. Cao, E. Seok, and K. O, "192 GHz push-push VCO in 0.13 μm CMOS," Electronic Letters, vol. 42, No. 4, pp. 208-210 (2006).
H. Rücker, et al., "A 0.13-μm SiGe BiCMOS technology featuring fT-fmax of 240/330 GHz and gate delays below 3 ps," IEEE Journal of Solid-State Circuits, vol. 45, No. 9, pp. 1678-1686 (2010).
Federico Vecchi et al., "A Wideband Receiver for Multi-Gbit/s Communications in 65 nm CMOS," IEEE Journal of Solid State Circuits, vol. 49, pp. 551-561 (2011).
E. Afshari and R. Han, "Progress Towards mW-power Generation in CMOS THz Signal Sources," IEEE Microwave Integrated Circuits Conference (EuMIC), pp. 117-120 (2013).
Yi-Xuan Lu, et al., "Focused source formation using a micro disc-like patch antenna array for THz CMOS transceiver applications," Transducers 2017, pp. 2147-2150 (2017).
C.-H. Li, et al., "A 37.5-mW 8-dBm-EIRP 15.5-HPBW 338-GHz Terahertz Transmitter Using SoP Heterogeneous System Integration," IEEE Transactions on Microwave Theory and Technology, vol. 63, pp. 470-480 (2015).
Chevalier et al., "230-GHz Self-Aligned SiGeC HBT for Optical and Millimeter-Wave Applications," IEEE Journal of Solid-State Circuits, vol. 40, No. 10, pp. 2025-2034 (2005).
A. V. Muravjov, et al., "Temperature dependence of plasmonic terahertz absorption in grating-gate GaN HEMT structures," Appl. Physics Lett, 96, 042105 (2010).
T. Watanabe, et al., "InP- and GaAs-based plasmonic high-electron-mobility transistors for room temperature ultrahigh-sensitive terahertz sensing and imaging," IEEE Sensors J. 13, 89-99 (2013).
M. Karabiyik, et al., "Plasmonic properties of asymmetric dual grating gate plasmonic crystals," Physica Status Solidi (B), vol. 253, Issue 4, pp. 671-675 (2016).
V. Yu, et al., "Current-induced terahertz oscillations in plasmonic crystal," Appl. Phys. Lett. 100, 232108 (2012).
G. R. Aizin, et al., "Current driven "plasmonic boom" instability in gated periodic ballistic nanostructures," Phys. Rev. B 93, No. 19, 195315 (2016).
G. R. Aizin, et al., "Current driven Dyakonov-Shur instability in ballistic nanostructures with a stub," Proceedings of the 2018 Compound Semiconductor Week, pp. 293-294 (2018).
A. S. Petrov, et al., "Amplified-reflection plasmon instabilities in grating-gate plasmonic crystals," Phys. Rev. B 95, 045405 (2017).
W. Knap, et al., "Nonresonant Detection of Terahertz Radiation in Field Effect Transistors," J. Appl. Phys. vol. 91, No. 11, 9346-9353 (2002).
G. Rupper and S. Rudin and M. S. Shur, "Ratchet Effect in Partially Gated Field Effect Multi Finger Transistors," Phys. Rev. Applied Physics, 9, 064007 (2018).
M. Dyakonov and M. S. Shur, "Shallow Water Analogy for A. Ballistic Field Effect Transistor. New Mechanism of Plasma Wave Generation by DC Current," Phys. Rev. Lett. vol. 71, No. 15, pp. 2465-2468, Oct. 11, 1993.
M. Dyakonov and M. S. Shur, "Current Instability of Plasma Waves Generation in Ungated Two-Dimensional Electron Layers," International Journal of High Speed Electronics and Systems, vol. 16, No. 2, pp. 443-451 (2006).
V. Ryzhii, A. Satou, M. S. Shur, "Transit-time mechanism of plasma instability in high-electron mobility transistors," Phys. Stat. Sol. (A) 202, No. 10, R113-R115 (2005).
X. Liu, T. Ytterdal, and M. Shur, "Plasmonic FET Terahertz Spectrometer," IEEE Access, pp. 1-6, 2020.
J. Park, X. Liu, T. Ytterdal, and M. Shur, "Carbon Nanotube Detectors and Spectrometers for the Terahertz Range", Crystals 2020, 10, 601.
Y. Byun, K. Lee, and M. S. Shur, "Unified Charge Control Model and Subthreshold Current in Heterostructure Field Effect Transistors," IEEE Electron Device Letters, EDL-11, No. 1, pp. 50-53, Jan. 1990, and correction in IEEE Electron Device Letters, EDL-11, No. 6, p. 273, Jun. 1990.
D. S. Katzer, et al., "Epitaxial metallic β-Nb2N films grown by MBE on hexagonal SiC substrates," Applied Physics Express, vol. 8, p. 085501, (2015).
D. J. Meyer, et al., "Epitaxial Lift-Off and Transfer of III-N Materials and Devices from SiC Substrates," IEEE Transactions on Semiconductor Manufacturing, vol. 29, pp. 384-389, (2016).
R. Yan, et al., "GaN/NbN epitaxial semiconductor/superconductor heterostructures," Nature, vol. 555, p. 183, (2018).
S. O. Potashin, V. Yu. Kachorovskii, and M. Shur, "Hydrodynamic Inverse Faraday Effect in Two Dimensional Electron Liquid," arXiv:2001.08015v1 [cond-mat.mes-hall] Jan. 22, 2020.
D.M. Yermolaev et al., "Detection of Terahertz Radiation by Array of Integrated Field-Effect Transistors with Floating Electrodes," 2016 Global Symposium on Millimeter Waves (GSMM) & ESA Workshop on Millimetre-Wave Technology and Applications.
J.S. Sun et al., "High-responsivity, low-noise, room-temperature, self-mixing terahertz detector realized using floating antennas on a GaN-based field-effect transistor," Applied Physics Letters 100, 013506 (2012).
Tomotaka Hosotani et al., "Terahertz Emission from an Asymmetric Dual-Grating-Gate InGaAs High-Electron-Mobility Transistor Stimulated by Plasmonic Boom Instability," 2019 44th International Conference on Infrared, Millimeter, and Terahertz Waves (IRMMW-THz).
Toshikazu Onishi et al, "High power terahertz emission from a single gate AlGaN/GaN field effect transistor with periodic Ohmic contacts for plasmon coupling," Applied Physics Letters 97, 092117 2010.

* cited by examiner

FLOATING GATES

BARRIER LAYER

DEVICE AND METHOD FOR MANAGING ELECTROMAGNETIC RADIATION

CROSS-REFERENCE

This application is a Nonprovisional of and claims the benefit of priority under 35 U.S.C. § 119 based on U.S. Provisional Patent Application No. 62/890,627 filed on Aug. 23, 2019. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case #109643.

TECHNICAL FIELD

The present invention relates to terahertz and far infrared detectors and sources. In particular, the present invention describes new electronic terahertz and far infrared detectors and sources that could be implemented using a variety of semiconductor material including (but not limited to) GaN, AlGaN, InGaAs, GaAs, Si, AlInN, AlInGaN, and InGaN.

BACKGROUND

The state-of-the-art mainstream THz electronics detectors, mixers, frequency multipliers and sources use Schottky diodes, multiplier chains, Gunn, and IMPATT diodes operating at a lower bound of the THz range or drive Schottky diode multiplier chains to achieve THz sources operating at higher frequencies. See M. Shur, Terahertz Sensing Technology, Special issue of the International Journal of High-Speed Electronics, and Systems, Vol. 24, Nos. 1 & 2 (2015). Resonant tunneling diodes (RTD), and RTD arrays as well as photomixers also compete for applications as THz sources. See R. A. Lewis, "A review of terahertz sources," J. Phys. D: Appl. Phys. 47 (2014).

Gunn bipolar devices have also demonstrated room temperature sub-THz emission in milliwatt power ranges with nanosecond pulse duration, during superfast avalanche switching process due to collapsing high field domains propagating in current filaments, as was predicted by Gelmont et al. See L. Gelmont and M. S. Shur, "High-Field Domains in the Presence of Electron-Hole Pairs," Phys. Lett. Vol. 36A, No. 4, pp. 305-307 (1971); and S. N. Vainshtein, V. S. Yuferev, and J. T. Kostamovaara, "Ultrahigh field multiple Gunn domains as the physical reason for superfast (picosecond range) switching of a bipolar GaAs transistor," Appl. Phys. 97, 024502 (2005).

Si CMOS and SiGe BiCMOS and SiGe HBTs are already competitive in the 300 to 600 THz range. See E. Y. Seok et al., "410-GHz CMOS Push-push Oscillator with a Patch Antenna," 2008 International Solid-State Circuits Conference, pp. 472-473 (2008); C. Cao, E. Seok, and K. O, "192 GHz push-push VCO in 0.13 µm CMOS," Electronic Letters, Vol. 42, No. 4, pp. 208-210 (2006); H. Rücker, et al., "A 0.13-µm SiGe BiCMOS technology featuring fT-fmax of 240/330 GHz and gate delays below 3 ps," IEEE Journal of Solid-State Circuits, Vol. 45, no. 9, pp. 1678-1686 (2010); Federico Vecchi et al., "A Wideband Receiver for Multi-Gbit/s Communications in 65 nm CMOS," IEEE Journal of Solid State Circuits, Vol. 49, pp. 551-561 (2011); E. Afshari and R. Han, "Progress Towards mW-power Generation in CMOS THz Signal Sources," IEEE Microwave Integrated Circuits Conference (EuMIC), pp. 117-120 (2013); Yi-Xuan Lu, et al., "Focused source formation using a micro disc-like patch antenna array for THz CMOS transceiver applications," Transducers 2017, pp. 2147-2150 (2017); C.-H. Li, et al., "A 37.5-mW 8-dBm-EIRP 15.5-HPBW 338-GHz Terahertz Transmitter Using SoP Heterogeneous System Integration," IEEE Transactions on Microwave Theory and Technology, Vol. 63, pp. 470-480 (2015); and Chevalier et al., "230-GHz Self-Aligned SiGeC HBT for Optical and Millimeter-Wave Applications," IEEE Journal of Solid-State Circuits, Vol. 40, No. 10, pp. 2025-2034 (2005).

Si CMOS with smaller features sizes (e.g., down to 7 nm, such as expected to be used in the 2018 Apple iPhone) might reach higher frequencies and exhibit better performance.

However, all of these approaches face a difficulty related to the large difference between the THz electromagnetic wavelength and device dimension, the latter of which is orders of magnitude smaller than the former.

This difficulty was addressed in grating gate devices, proposed plasmonic boom devices, and periodic structures using Dyakonov-Shur Instability. See U.S. Pat. No. 7,638,817 to M. Shur and R. Gaska, "Device and method for managing radiation" (2009); A. V. Muravjov, et al., "Temperature dependence of plasmonic terahertz absorption in grating-gate GaN HEMT structures," Appl. Physics Lett, 96, 042105 (2010); T. Watanabe, et al., "InP- and GaAs-based plasmonic high-electron-mobility transistors for room-temperature ultrahigh-sensitive terahertz sensing and imaging," IEEE Sensors J. 13, 89-99 (2013); M. Karabiyik, et al., "Plasmonic properties of asymmetric dual grating gate plasmonic crystals," Physica Status Solidi (B), Volume 253, Issue 4, pp. 671-675 (2016); V. Yu, et al., "Current-induced terahertz oscillations in plasmonic crystal," Appl. Phys. Lett. 100, 232108 (2012); G. R. Aizin, et al., "Current driven 'plasmonic boom' instability in gated periodic ballistic nanostructures," Phys. Rev. B 93, No 19, 195315 (2016); G. R. Aizin, et al., "Current driven Dyakonov-Shur instability in ballistic nanostructures with a stub," Proceedings of the 2018 Compound Semiconductor Week, pp. 293-294 (2018); and A. S. Petrov, et al., "Amplified-reflection plasmon instabilities in grating-gate plasmonic crystals," Phys. Rev. B 95, 045405 (2017).

However, these structures require the same potential difference between the gates and the channel, which is very difficult to achieve due to resistive voltage drops throughout the channel. To this extent, a need exists for a solution that overcomes this limitation. In particular, there exists a need for a device and method for managing radiation, such as terahertz and/or microwave radiation using structures not requiring multiple, complex connections to grating gates to ensure a consistent potential difference between the gates and the channel.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides semiconductor devices having one or more conductive floating gates superimposed on and/or embedded within a conducting channel for managing electromagnetic radiation within the device.

In some embodiments, the conductive floating gates comprise a one- or two-dimensional array of asymmetric structures superimposed on and/or embedded within the conducting channel.

In some embodiments, the conductive floating gates comprise one or more concentric structures surrounding a central source.

In some embodiments, one or more of the conductive floating gates can be isolated from the conducting channel by a barrier layer.

In some embodiments, some of the conductive floating gates can be embedded into the channel while others some are superimposed on and separated from the channel.

In some embodiments, one or more conductive floating gate in the semiconductor device can comprise $Nb_2N$, $Ta_2N$, $TaN_x$, $NbN_x$, $WN_x$, or $MoN_x$, graphene, or any transition metal nitride ternary compound.

In some embodiments, the conductive floating gates can comprise semiconducting or metallic nanoparticles or nanocrystals.

In some embodiments, the semiconductor device also includes a plurality of conductive floating gates situated on a rear surface of a barrier layer, wherein each of the conductive floating gates might be separately biased for individual tuning.

In some embodiments, antennas for capturing or emitting THz or sub-THz radiation could be attached to the device contacts. Terahertz or infrared radiation could be manipulated (such as emitted, detected, or frequency multiplied) by driving a current through the conducting channel into a plasmonic boom regime, such as the drift velocity is modulated by the presence of the conductive floating gates to rise above and then drop below the plasma wave velocity in the channel.

Additional manipulation of the electromagnetic radiation could be achieved by having antennas with an appropriate phase angle shift.

DETAILED DESCRIPTION

Figure 1A:
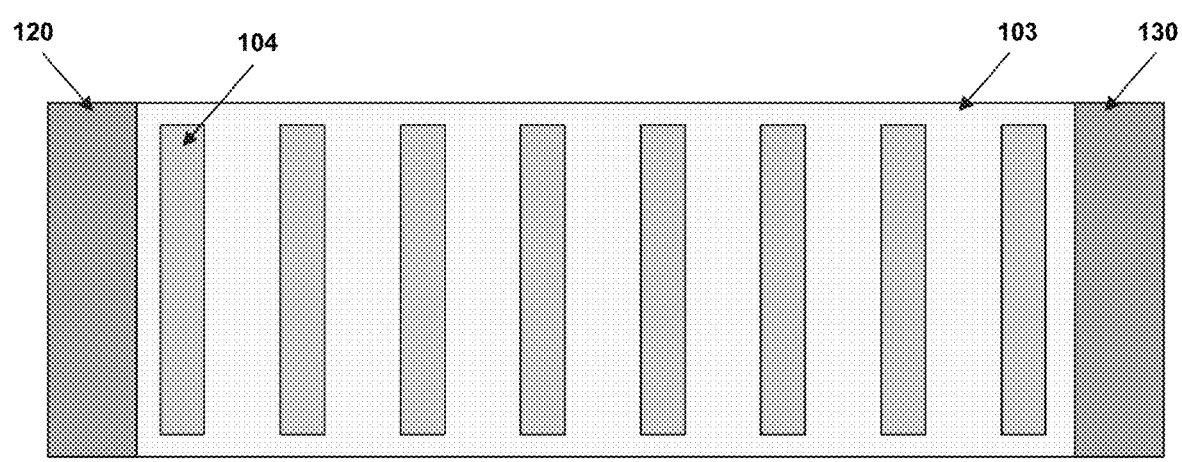
FIGS. 1A-1C are block schematics showing a top view illustrating aspects of exemplary configurations of a semiconductor device having one or more conductive floating gates in a one- or two-dimensional linear array superimposed on a conducting channel.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

It is understood that for purposes of this description Al means Aluminum, Ga means Gallium, N means Nitrogen, In means Indium, Si means Silicon, O means Oxygen, C means Carbon, As means Arsenic, Li means Lithium, Nb means Niobium, Ge means Germanium, Sb means Antimony, and P means Phosphorus. Further, it is understood that "group II elements" comprise the elements Beryllium (Be), Magnesium (Mg), Calcium (Ca), Strontium (Sr), Barium (Ba), and Radium (Ra), "group III elements" comprise the elements Al, Ga, In, Boron (B), and Thallium (Tl), "group IV elements" comprise the elements C, Si, Ge, Tin (Sn), and Lead (Pb), and "group VI elements" comprise the elements O, Sulfur (S), Selenium (Se), Tellurium (Te) and Polonium (Po).

It is further understood that "terahertz radiation" comprises radiation having a frequency between approximately 0.1 and 100 terahertz ($10^{12}$ Hertz), and "microwave radiation" comprises radiation having a frequency between approximately 1 and 100 Gigahertz ($10^9$ Hertz).

The present invention provides semiconductor devices that enable the use of plasma waves to manage the detection and emission of terahertz and/or microwave radiation.

The values of the plasma wave velocity in a gated 2D system is given by $$s = \sqrt{\frac{\eta k_B T}{qm}\left(1+\exp\left(\frac{-qU_{gt}}{\eta k_B T}\right)\right)\ln\left(1+\exp\left(\frac{qU_{gt}}{\eta k_B T}\right)\right)} \quad (1)$$

where $U_{gt}=U_{gs}-U_t$ is the gate voltage swing, $U_{gs}$ is the gate-to-source voltage, $U_t$ is the threshold voltage, $k_B$ is the Boltzmann constant, $\eta$ is the subthreshold ideality factor, T is temperature, q is the electronic charge, and m is the electron or hole effective mass for the n-channel and p-channel devices, respectively. See W. Knap, et al., "Nonresonant Detection of Terahertz Radiation in Field Effect Transistors," *J. Appl. Phys.* Vol. 91, No 11, 9346-9353 (2002).

The values of the plasma frequency are given by $$\omega = \frac{ns}{L_{eff}} \quad n=1, 2, 3, \ldots \quad (2)$$

where $L_{eff}$ is the effective period of the structure determined by the conductive floating gate length and the boundary conditions at the channel edges under the gate.

As described in more detail below, the present invention manages the plasma waves and thereby manages the ability of a device to detect and/or emit radiation in the THz to far infrared range by providing devices having a plurality of conductive floating gates above or within the conducting channels modulated by the conductive floating gates.

The modulation mechanism is provided by the frequency dependent absorption of the electromagnetic radiation that depends on the excitation of the resonant or decayed plasma waves in the electronic fluid.

The electronic fluid is defined as an ensemble of electrons having frequent electron-electron collisions and, therefore, described by hydrodynamic equations as explained in more details in G. Rupper and S. Rudin and M. S. Shur, "Ratchet Effect in Partially Gated Field Effect Multi Finger Transistors," *Phys. Rev. Applied Physics*, 9, 064007 (2018). The plasma waves are the waves of the electron density varying in time and space. The mechanism of the electromagnetic interaction with the plasma waves was described in M. I. Dyakonov and M. S. Shur, "Plasma Wave Electronics: Novel Terahertz Devices using Two-Dimensional Electron Fluid, Special Issue on Future Directions in Device Science and Technologies," *IEEE Transactions on Electron Devices*, Vol. 43, No. 10, pp. 1640-1646, October (1996).

The embodiments described here allow modulating the properties of the plasma waves using conductive floating gates. Since the charge in each conductive floating gate is determined by the voltage distribution under these gates, the sections of the proposed device structure can operate in synchrony. Therefore, each conductive floating gate could be smaller than the mean free path of the electrons for their collisions with impurities or lattice vibrations, whereas the entire structure could be quite large and be comparable with the wave length of the electromagnetic radiation, which is for 1 THz is 300 micron. A typical conductive floating gate size could range from 10 nm to 500 nm.

Also, there are four basic mechanisms for achieving the generation of electromagnetic radiation due to the instabilities of the plasma waves (which are very similar to the wave excitation in an ocean, lake, or river): Dyakonov-Shur instability (see M. Dyakonov and M. S. Shur, "Shallow Water Analogy for A. Ballistic Field Effect Transistor. New Mechanism of Plasma Wave Generation by DC Current," *Phys. Rev. Lett.* Vol. 71, No. 15, pp. 2465-2468, Oct. 11 (1993)); ungated plasma instability (see M. Dyakonov and M. S. Shur, "Current Instability of Plasma Waves Generation in Ungated Two-Dimensional Electron Layers," *International Journal of High Speed Electronics and Systems*, Vol. 16, No. 2, pp. 443-451 (2006); Ryzhii-Satou-Shur mechanism (see V. Ryzhii, A. Satou, M. S. Shur, "Transit-time mechanism of plasma instability in high-electron mobility transistors," *Phys. Stat. Sol. (A)* 202, No. 10, R113-R115 (2005)); and "the plasmonic boom" mechanism (see G. R. Aizin, J. Mikalopas, M. Shur, "Current driven 'plasmonic boom' instability in gated periodic ballistic nanostructures," *Phys. Rev. B* 93, No 19, 195315, May 2016).

All these mechanisms could support plasmonic instabilities and, hence, electromagnetic radiation in the proposed structures with the conductive floating gates. Also, exciting the structures with the conductive floating gates by the radio frequency signal using the radio frequency antenna and collecting the output radiation for a higher frequency, such as THz frequency) radiation from a terahertz antenna as was proposed for the structure with the biased gates in G. R. Aizin, J. Mikalopas, and M. Shur, "Current driven Dyakonov-Shur instability in ballistic nanostructures with a stub," *Phys. Rev. Applied*, 10, 064018 (2018), could be much easier to achieve in the structures with conductive floating gates because it eliminates the problem of providing different gate biases to the different device sections.

As described in more detail below, a semiconductor device having one or more conductive floating gates in accordance with the present invention can take many forms.

The present invention provides semiconductor devices having one or more conductive floating gates superimposed on and/or embedded within a conducting channel to manage electromagnetic radiation within the device.

In some embodiments, the conductive floating gates comprise a one- or two-dimensional array of asymmetric structures superimposed on and/or embedded within the conducting channel.

In some embodiments, the conductive floating gates comprise one or more concentric structures surrounding a central source.

In some embodiments, one or more of the conductive floating gates can be isolated from the conducting channel by a barrier layer.

In some embodiments, some of the conductive floating gates can be embedded into the channel while others some are superimposed on and separated from the channel.

In some embodiments, one or more conductive floating gate in the semiconductor device can comprise $Nb_2N$, $Ta_2N$, $TaN_x$, $NbN_x$, $WN_x$, $MoN_x$, graphene, or any transition metal nitride ternary compound.

In some embodiments, the conductive floating gates can comprise semiconducting or metallic nanoparticles or nanocrystals.

In some embodiments, the semiconductor device includes a plurality of conductive floating gates situated on a rear surface of a barrier layer, wherein each of the conductive floating gates is separately biased for individual tuning to compensate for the voltage drop along the channel.

In some embodiments, antennas for capturing or emitting THz or sub-THz radiation could be attached to the device contacts. Terahertz or infrared radiation could be manipulated (such as emitted, detected, or frequency multiplied) by driving a current through the conducting channel into a plasmonic boom regime, such as the drift velocity is modulated by the presence of the conductive floating gates to rise above and then drop below the plasma wave velocity in the channel.

The block schematics in FIGS. 1A-1C, 2A-2C, 3A-3B, 4-7, and 11-14 illustrate various exemplary embodiments of a semiconductor device having one or more conductive floating gates incorporated therein in accordance with the present invention. As described in more detail below, the conductive floating gates adjust to the channel potential and alleviate the problems related to the voltage drop across the channel and, therefore, makes it possible for the device sections to operate in synchrony.

It will be noted here that in the FIGURES and the description below, elements that appear in multiple FIGURES are denoted by the same reference number, with only the first digit(s) changing to reflect the FIGURE number in which the element appears. For example, conductive floating gate is denoted by reference number 101 in FIG. 1 and by reference number 501 in FIG. 5. In addition, where specific materials or material layer structures are described as being used in the semiconductor device, one skilled in the art will understand that such materials and/or material layer structures are merely exemplary, and that other materials and material layer structures may be used as appropriate.

Figure 1B:
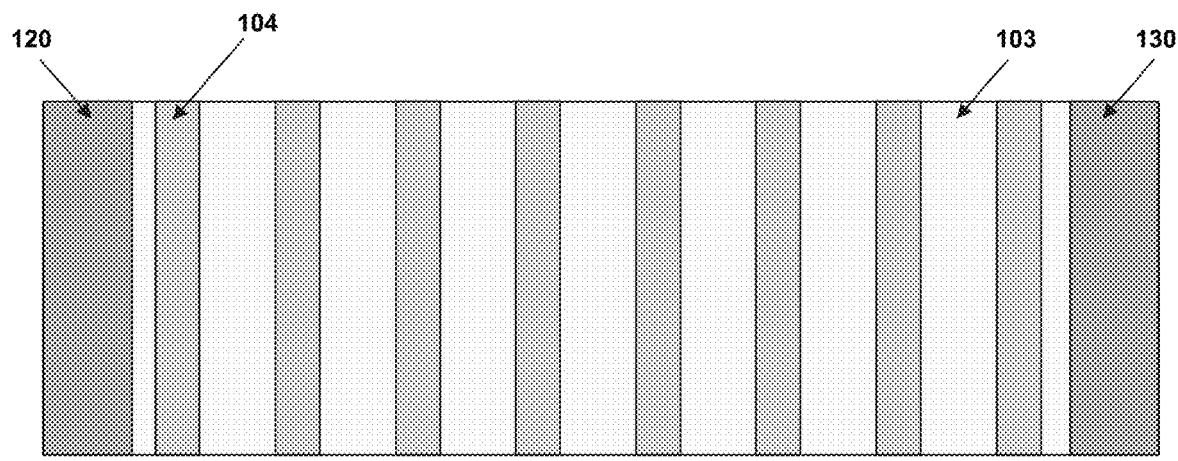
Figure 1C:
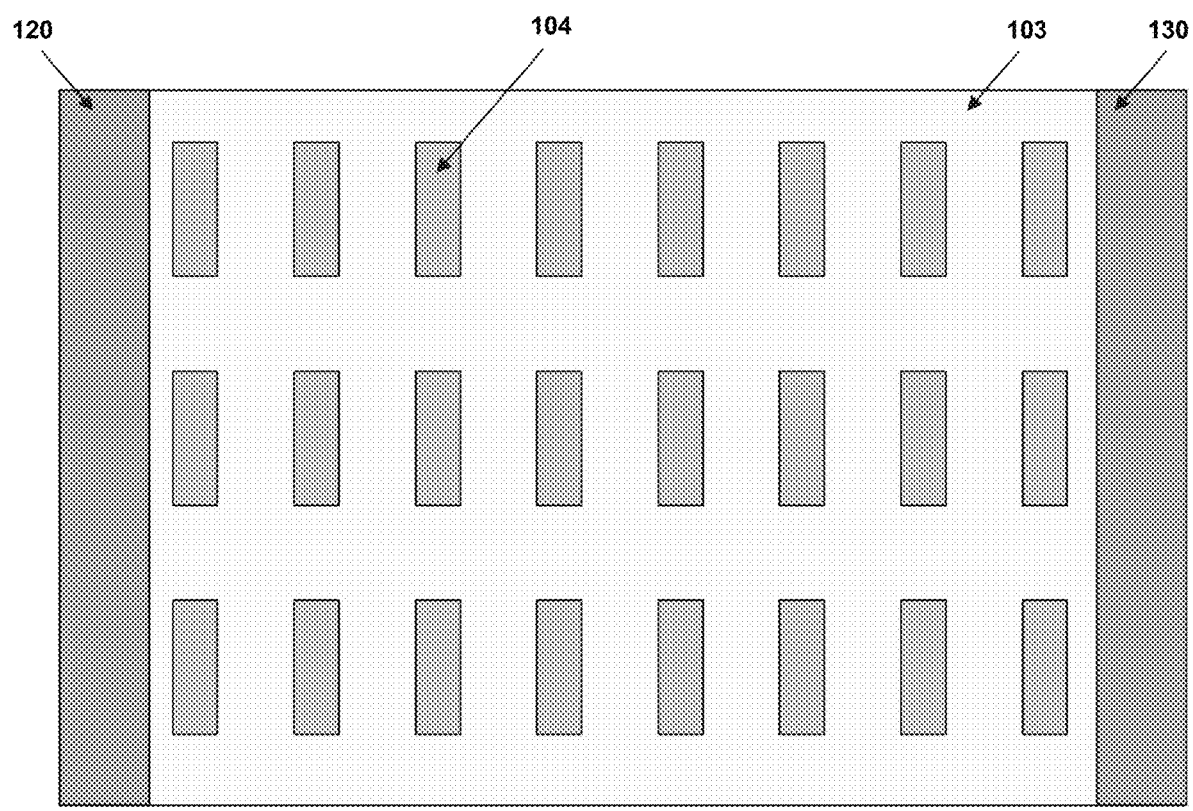

FIGS. 1A-1C illustrate general principles regarding conductive floating gates that can be used in both prior art devices and in devices in accordance with the present invention. As illustrated in FIGS. 1A-1C, semiconductor devices incorporating conductive floating gates can include a source 120, a drain 130, and a plurality of symmetric spaced-apart conductive floating gates 104 superimposed on an upper surface of a conducting channel 103 arranged in a periodic array.

The array periodicity is determined by the operating frequency and by the mean free path or the electrons in the device channel. An approximate link between the materials properties, frequencies of operation and the period could be established from FIG. 10 in X. Liu, T. Ytterdal, and M. Shur, "Plasmonic FET Terahertz Spectrometer," *IEEE Access*, pp. 1-6, 2020 and from FIG. 7b in J. Park, X. Liu, T. Ytterdal, and M. Shur, "Carbon Nanotube Detectors and Spectrometers for the Terahertz Range", *Crystals* 2020, 10, 601.

Such conductive floating gates can be in a single linear array which may (FIG. 1A) or may not (FIG. 1B) extend to the edge of the conducting channel, or could be in the form of a two-dimensional array (FIG. 1C).

FIGS. 2A-2C and 3A-3B illustrate general principles of semiconductor devices incorporating novel configurations of conductive floating gates in accordance with the present invention.

Figure 2A:
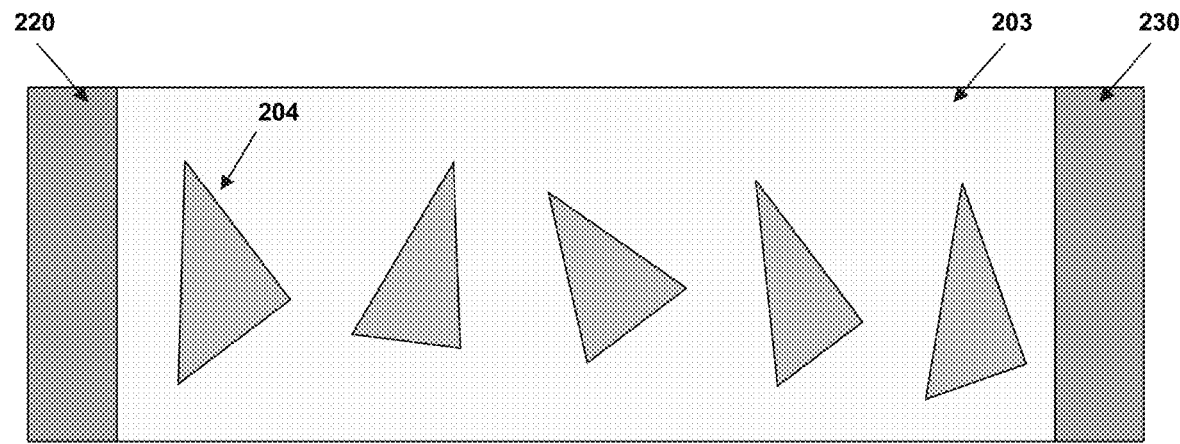
FIGS. 2A-2C are block schematics illustrating aspects of exemplary configurations of a semiconductor device having one or more asymmetrical conductive floating gates in a one- or two-dimensional array superimposed on a conducting channel in accordance with the present invention.
Figure 2B:
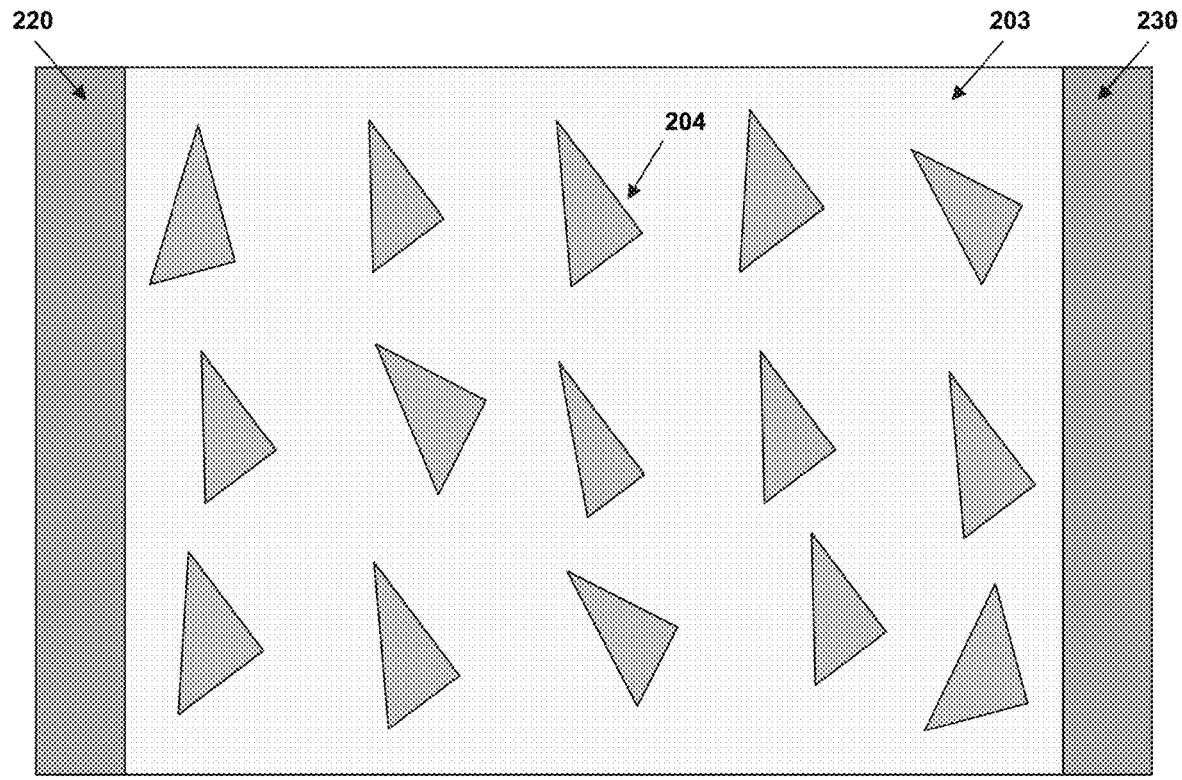
Figure 2C:
Figure 2C:
Figure 2C:
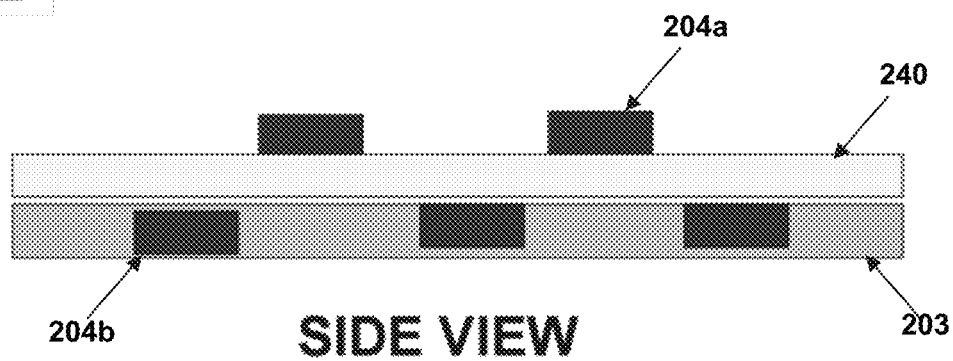
Figure 2C:

For example, as illustrated in FIGS. 2A and 2B, in some embodiments, a semiconductor device in accordance with the present invention can include a source 220, a drain 230, and a linear (FIG. 2A) or two-dimensional (FIG. 2B) array of conductive floating gates 204 arranged on the conducting channel 203, where the conductive floating gates 204 are not symmetrical, but which instead are asymmetrical and/or irregular in size, shape, or spacing. The asymmetry of the gates in these embodiments can create a preferred direction allowing for the rectification of the impinging electromagnetic radiation. It also makes the structure to be sensitive to the polarization if the impinging electromagnetic radiation. In other embodiments, such as that illustrated by the block schematic shown in FIG. 2C, the device includes two arrays of conductive floating gates 204a and 204b, with one array 204b being embedded within the conducting channel 203, and the other array 204a being on an upper surface of a barrier layer 240 situated on top of the conducting channel 203. As illustrated in FIG. 2C, the two arrays of conductive floating gates can be offset from one another so as to provide an alternating configuration of gates embedded within and situated on top of the device.

Figure 3A:
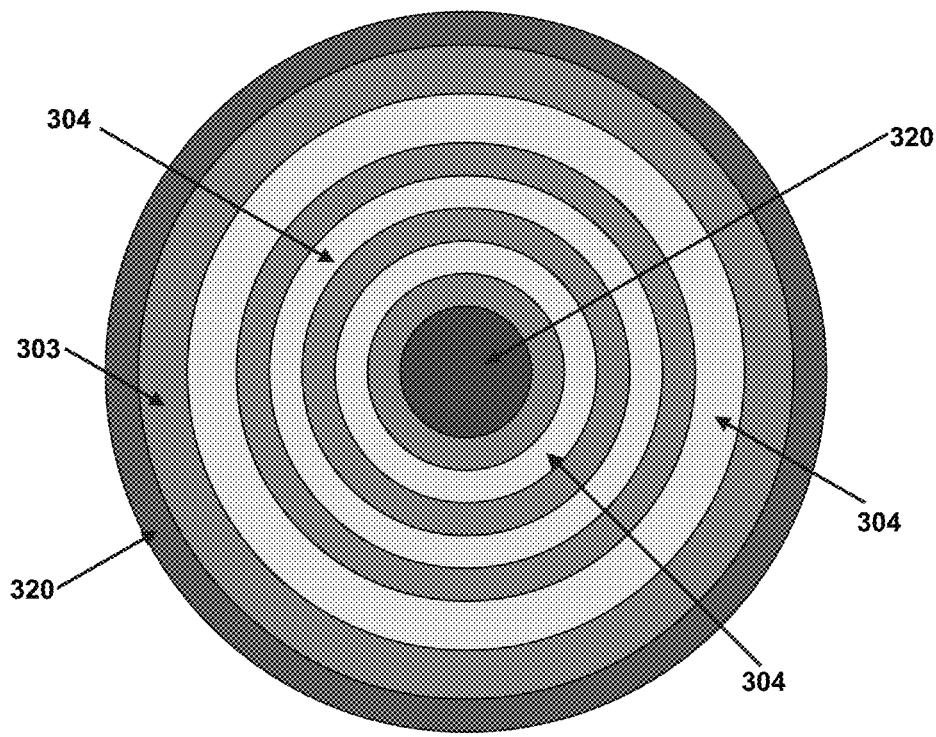
FIGS. 3A and 3B are block schematics illustrating a top view of exemplary embodiments in which the conductive floating gates comprise a circular array of conductive floating gates superimposed on the surface of the conducting channel.
Figure 3B:
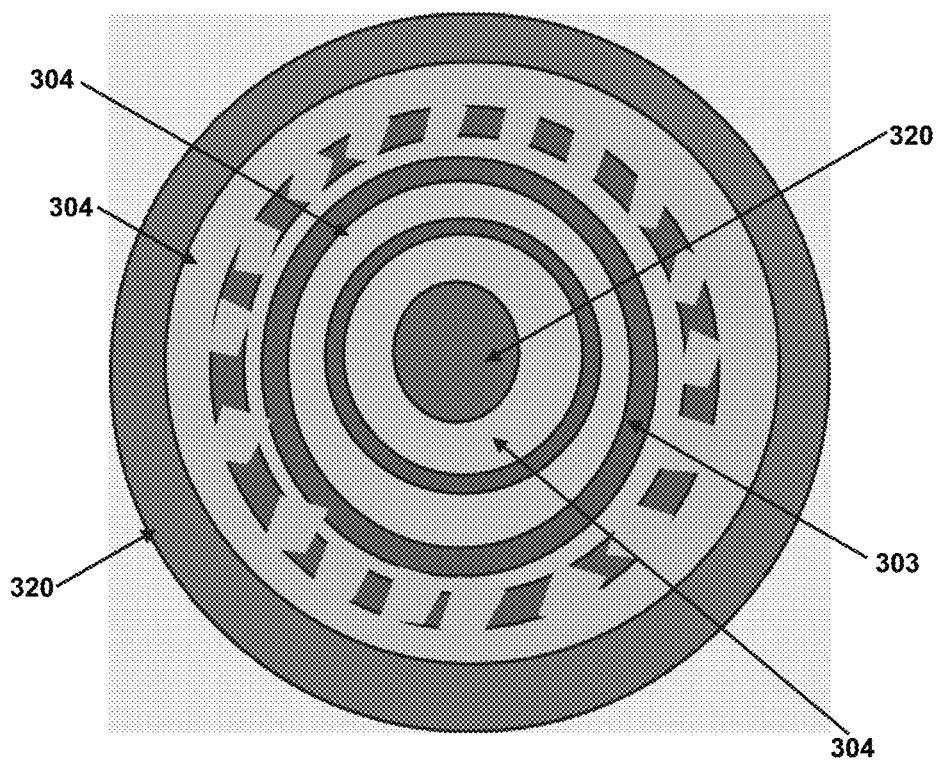

In other embodiments, such as those illustrated in FIGS. 3A and 3B, the conductive floating gates can comprise an array of concentric structures 304 superimposed on conducting channel 303 and surrounding a central source 320, with the drain comprising the outermost ring 330. In some cases, such as the case illustrated in FIG. 3B, one or more of the conductive floating gates 304 can be perforated. Using a circular or other concentric array of conductive floating gates allows for a more efficient capture of a circular radiation beam. The perforations could form a resonant plasmonic structure if the perforation period is chosen to coincide with the plasma wave half-length or its multiples.

Any one or more of these general configurations of conductive floating gates can be incorporated into a semiconductor device in accordance with the present invention.

Exemplary embodiments of such semiconductor devices incorporating one or more arrays of conductive floating gates in accordance with the present invention are illustrated by the block schematics in FIGS. 4-7.

Figure 4:
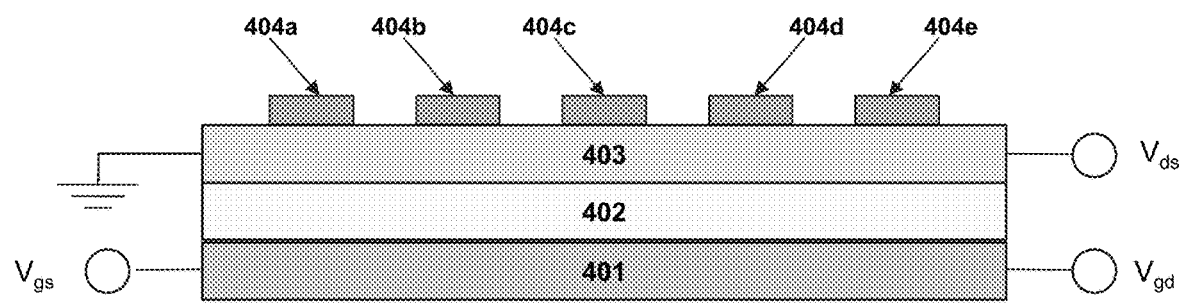
FIG. 4 is a block schematic illustrating a side view of an exemplary semiconductor device having one or more conductive floating gates superimposed on a conducting channel in accordance with the present invention, with the barrier layer separating the conducting channel from the conductive floating gate.

The block schematic in FIG. 4 illustrates general principles of a semiconductor device in accordance with the present invention. Thus, as illustrated in FIG. 4, a semiconductor device in accordance with the present invention includes a conductive floating gate 401, a conducting channel 403, a barrier layer 402 separating the conductive floating gate from the conducting channel, and a plurality of spaced-apart conductive floating gates 402*a/b/c/d/e* situated on an upper surface of the conducting channel.

As described above, the conductive floating gates in this embodiment can be in the form of a one- or two-dimensional array of symmetric elements such as those shown in FIGS. 1A-1C, can be in the form of a one- or two-dimensional array of asymmetric or irregularly shaped elements such as those shown in FIGS. 2A-2B, or can be in the form of an array of concentric elements such as those shown in FIGS. 3A-3B. In many embodiments, the conductive floating gates are separated from one another by a distance smaller than the mean free path of electrons in the ungated sections of the channel, though other configurations of the spacing of the gates can be employed where appropriate. The voltage sources attached to conductive floating gates are used to tune the plasma frequency by tuning the carrier concentration in the channel as described in detail in Y. Byun, K. Lee, and M. S. Shur, "Unified Charge Control Model and Subthreshold Current in Heterostructure Field Effect Transistors," *IEEE Electron Device Letters*, EDL-11, No. 1, pp. 50-53, January 1990, see also correction *IEEE Electron Device Letters*, EDL-11, No. 6, p. 273, June (1990).

The conductive floating gate allows a voltage drop across the gate that compensates for the voltage drop along the conducting channel and allows all of the conductive floating gates to operate in synchrony which means the plasma frequency is the same for each period of the structure.

Figure 5:
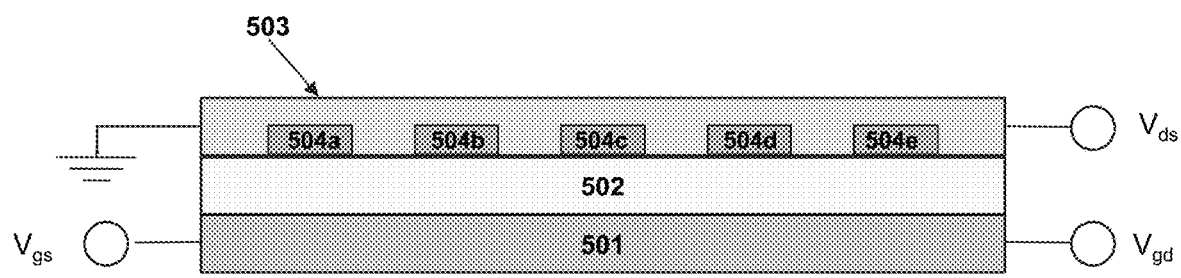
FIG. 5 is a block schematic illustrating a side view of another exemplary semiconductor device having one or more conductive floating gates in accordance with the present invention, with the conductive floating gates embedded within the device at the bottom of the conducting channel and with the barrier layer separating the conducting channel from the gate.

The block schematic in FIG. 5 illustrates aspects of an alternative embodiment of a semiconductor device incorporating conductive floating gates in accordance with the present invention, in which the conductive floating gates are embedded within the device at the bottom of the conducting channel rather than being situated on its surface. Thus, as in the embodiment illustrated in FIG. 4, the embodiment illustrated in FIG. 5 includes conductive floating gate 501, conducting channel 503, and barrier layer 502 separating the conductive floating gate from the conducting channel, and further includes a plurality of spaced-apart conductive floating gates 504*a/b/c/d/e*, where the conductive floating gates are situated not on the surface of the conducting channel as in the embodiment illustrated in FIG. 4, but instead are situated at the bottom of conducting channel 503 so as to be embedded within the device.

In many embodiments, the conductive floating gates are separated from one another by a distance smaller than the mean free path of electrons in the ungated sections of the channel, though other configurations of the spacing of the gates can be employed where appropriate. Having the conductive floating gates be embedded within the device in accordance with this embodiment of the present invention enables the gates to provide enhanced channel control, since the ultimate proximity to the two-dimensional electron fluid dictates its effectiveness of electrostatic control and allows for a very efficient capacitive charge control. The thus-embedded conductive floating gates can be formed from doped semiconductors such as poly-Si, though other materials such as graphene, carbon nanotubes, and metals can also be used where appropriate.

Figure 6:
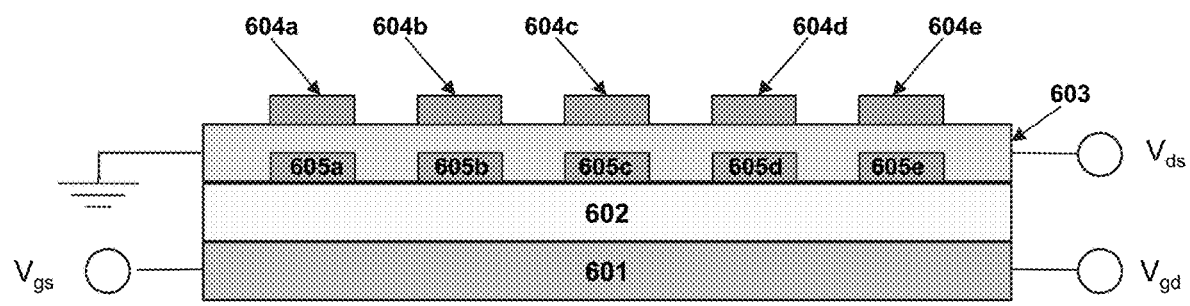
FIG. 6 is a block schematic illustrating a side view of another exemplary semiconductor device having one or more conductive floating gates in accordance with the present invention.

The embodiment illustrated in FIG. 6 combines aspects of the embodiments shown in FIG. 4 and FIG. 5. Thus, as illustrated by the block schematic shown in FIG. 6, in another embodiment of a semiconductor device in accordance with the present invention, a first array of superconducting floating gates 604*a/b/c/d/e* is superimposed on an upper surface of conducting channel 603, while a second corresponding array of conductive floating gates 605*a/b/c/d/e* is embedded within the device at the bottom of the conducting channel 603, where the embedded conductive floating gates 605*a/b/c/d/e* are laterally aligned with the superimposed gates 604*a/b/c/d/e* on the surface of the conducting channel. This allows for the phase shift between the spatial modulation of the two-dimensional electron fluid and the electric field created by the impinging electromagnetic radiation, hence breaking a symmetry and allowing for the rectification and frequency doubling of the impinging radiation. As in the embodiment described above with respect to FIG. 5, the presence of the embedded conductive floating gates 605*a/b/c/d/e* in accordance with this embodiment of the present invention enables the gates to provide enhanced channel control. In such embodiments, the embedded conductive floating gates 605*a/b/c/d/e* can be formed from doped semiconductors such as poly-Si though other materials such as metals, graphene, van der Walls materials can also be used where appropriate, while the superimposed conductive floating gates can be formed from same materials or different materials but from the same list of materials.

In another exemplary embodiment of a semiconductor device in accordance with the present invention, a second barrier layer is interposed between the conducting channel and the conductive floating gates.

Figure 7:
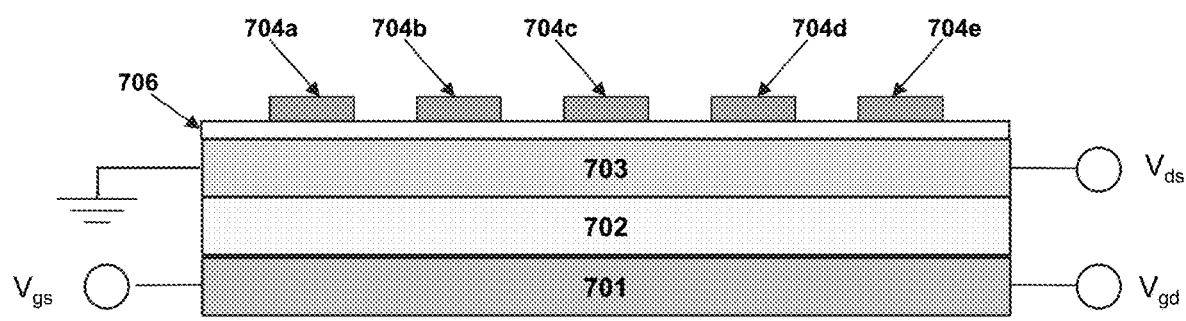
FIG. 7 is a block schematic illustrating a side view of another exemplary semiconductor device having one or more conductive floating gates superimposed on a conducting channel in accordance with the present invention.

Thus, as illustrated in FIG. 7, in this embodiment, a second barrier layer 706 is disposed on an upper surface of the conducting channel 703, with the array of conductive floating gates 704*a/b/c/d/e* being superimposed on an upper surface of this second barrier layer 706 rather than on an upper surface of the conducting channel 703. The barrier layer can be made of any suitable insulating material such as $SiO_2$, or can be made from SiN or a high-K material, such as $HfO_2$. In some embodiments, barrier layer 706 can also be formed from a semiconductor material having a band gap larger than that used to form conducting channel 703, and so could be GaN, AlN, AlGaN, AlGaAs, BN, or diamond depending on the material used for the conducting channel. The presence of this additional barrier layer 706 enables optimization of the device design and provides additional flexibility in tuning the operating regime by bias voltages.

Figure 8:
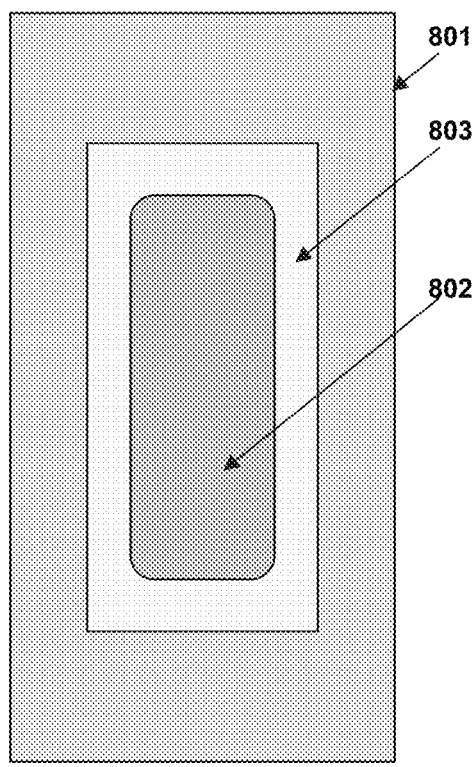
FIG. 8 is a block schematic illustrating a top view of the depletion region created at the boundaries of the conductive floating gate.
Figure 9:
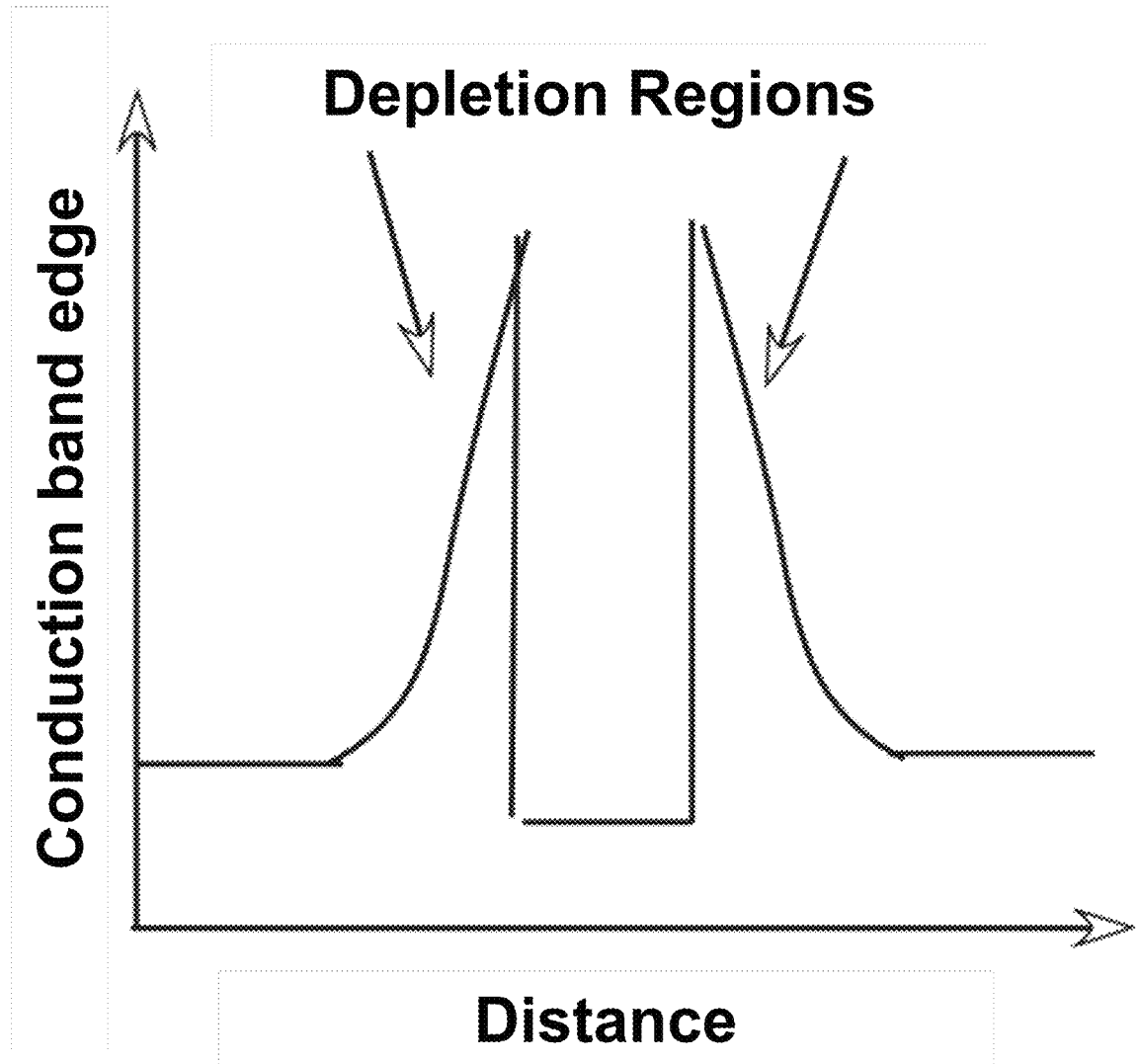
FIG. 9 is a plot showing the band diagram of the depletion region created at the boundaries of the conductive floating gate.
Figure 10A:
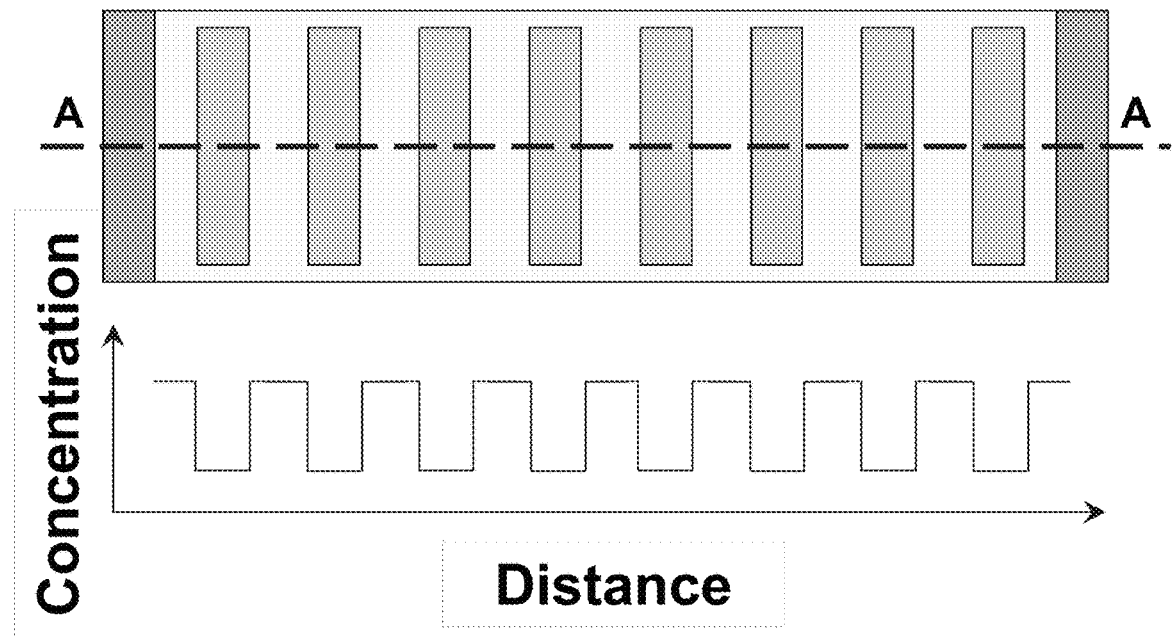
FIGS. 10A and 10B illustrate aspects of electron density (FIG. 10A) and electron drift velocity (FIG. 10B) in the conducting channel along the line A-A modulated by the conductive floating gates.
Figure 10B:
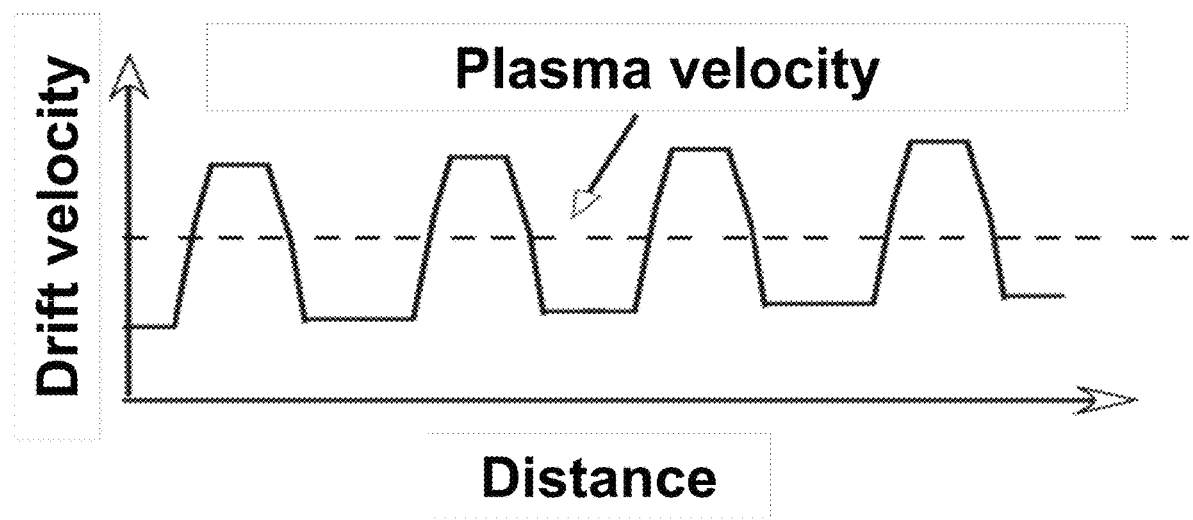

The conductive floating gates in the semiconductor devices illustrated in FIGS. 4-7 partially deplete the conducting channel as shown in FIGS. 8 and 9, and cause periodic modulation of the electron density ns in the conducting channel as shown in FIGS. 10A and 10B.

FIG. 8 shows the gate 802 surrounded by the gate 801 and the two-dimensional electronic fluid 803 located below and separated from the gates by a barrier layer. In one embodiment both gate could be floating. In another embodiment the gate 802 is floating and the gate 801 is biased. The gate geometry defines the plasmonic wave electric field pattern. In another embodiment. The elongation shape of the gate 801 makes the structure to be sensitive to the polarization of the electromagnetic radiation.

FIG. 9 shows the band diagram for one of the embodiments when the conductive floating gates create depletion regions at their edges and, as a consequence the potential barriers that could be tuned by the gate bias of the additional gated contact or by the current induced in the two-dimensional electron fluid.

FIG. 10A shows the modulation of the electron concentration in the two dimensional electron fluid induced by the conductive floating gates. This concentration modulation results in the electron velocity modulation, since the electron current, which is proportional to the product of the electron velocity and electron concentration must be constant. This means that the velocity is larger in the sections of the structure, where the electron concentration is smaller. This allows for the situation when the electron velocity could cross the plasma velocity leading to the plasmonic boom instability as schematically shown in FIG. 10 B.

When the drain to source voltage $V_{ds}$ is applied, the electron flow in the channel has the drift velocity v modulated in such a way that the flowing electric current I is constant:

$$I = qvn_s W \quad (3)$$

where W is the device width or device periphery in case of the circular geometry.

These designs are enabled by the presence of buried conductive floating gates as in the embodiments illustrated in FIGS. 5 and 6 described above.

However, recent technology has developed methods for growing $Nb_2N$, which is highly conductive and has low sheet resistance, on hexagonal Si substrates by molecular beam epitaxy. See D. S. Katzer, et al., "Epitaxial metallic β-$Nb_2N$ films grown by MBE on hexagonal SiC substrates," *Applied Physics Express*, vol. 8, p. 085501, (2015). $Nb_2N$, a hexagonal epitaxial conductor with less than 1% lattice mismatch to 4H- and 6H-SiC, could serve as the template for III-N device heterostructure growth, where this small mismatch minimizes the dislocation density and allows for growth of high-quality conductive floating gates.

In Katzer, RF-plasma MBE was used to epitaxially grow 4- to 100-nm-thick metallic β-$Nb_2N$ thin films on hexagonal SiC substrates. When the N/Nb flux ratios were greater than one, the most critical parameter for high-quality β-$Nb_2N$ was the substrate temperature. The X-ray characterization of films grown between 775 and 850° C. demonstrated β-$Nb_2N$ phase formation. The associated resistivity of these films was between 40 and 100 μΩ-cm, indicating a highly conductive behavior. This highly conductive behavior makes $Nb_2N$ a particularly advantageous material for use as conductive floating gates in a device in accordance with the present invention since it eliminates the parasitic gate resistance that may be present in other materials.

Measured results of epitaxial semiconductor devices that have been lifted off from their base 6H-SiC substrates and transferred to a Si wafer have indicated that electron transport properties and low power density electrical performance are nominally unchanged relative to values measured before release. See D. J. Meyer, et al., "Epitaxial Lift-Off and Transfer of III-N Materials and Devices from SiC Substrates," *IEEE Transactions on Semiconductor Manufacturing*, vol. 29, pp. 384-389, (2016). In such transfer techniques, a thin sacrificial layer of $Nb_2N$ is used to enable the transfer of the semiconductor device from their base substrate to the Si water. The lift-off and transfer technique has several advantages over competing techniques, such as the well-known smart cut method; these advantages include provision of bonding-ready released material with atomically-smooth backsides (≤0.5 nm rms), enablement of easy substrate reclaims with indefinite recycling potential, and use of a transfer process that can be performed after full front-side device processing and yield screening has been completed.

Although cubic NbN has been epitaxially integrated with AlN, GaN, and AlGaN to serve as a buried superconducting layer, see R. Yan, et al., "GaN/NbN epitaxial semiconductor/superconductor heterostructures," *Nature*, vol. 555, p. 183, (2018), it has not been used as a buried superconducting periodic gate structure or in conductive floating gates as in the devices of the present invention. Electrical results measured at low temperatures (5K) showed that a buried NbN superconductive load could be put in series with a GaN transistor. These results suggest that β-$Nb_2N$ and other transition metal containing nitride materials can be used to realize high crystalline quality metal/semiconductor heterostructures that cannot be fabricated at present with existing material sets.

The use of one- or two-dimensional arrays of asymmetric, irregular, and/or circular conductive floating gates as described above has been shown to improve the responsivity of the semiconductor devices in accordance with the present invention by improving the coupling efficiency of such devices to rectified plasma waves. In addition, the use of superconducting materials such as $Nb_2N$ as conductive floating gates—both in regular and irregular arrays and in circular and non-circular shapes—can minimize or even eliminate resistance in the gates, which in turn can lead to higher maximum frequency of operation and extremely low noise.

The block schematics in FIGS. 11-16 illustrate aspects of additional embodiments of a semiconductor device that incorporates one or more conductive floating gates in accordance with the present invention.

Figure 11:
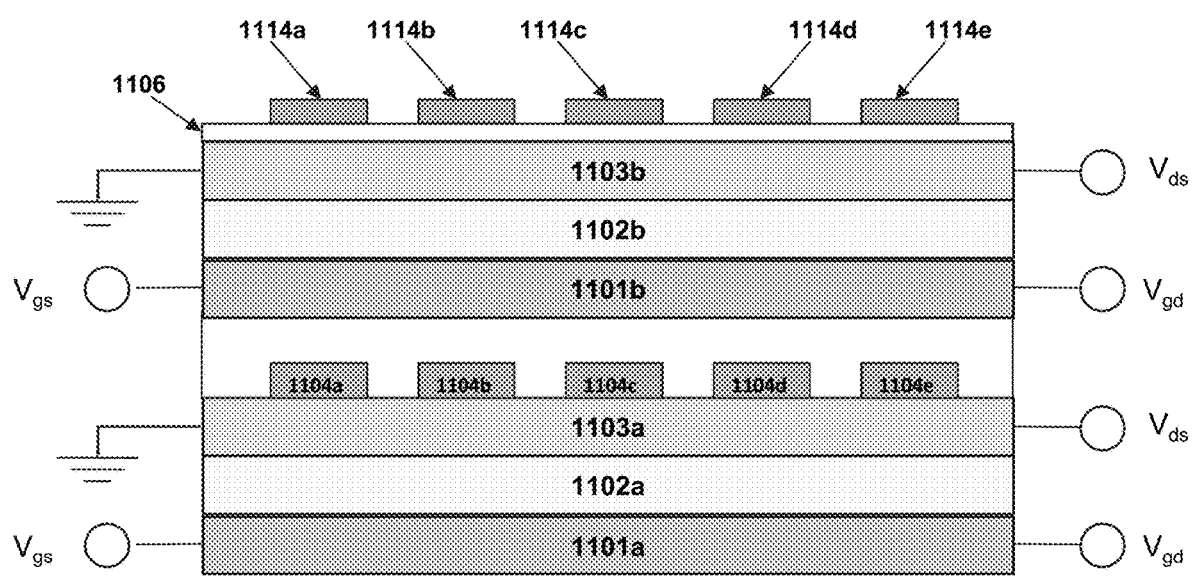
FIG. 11 is a block schematic illustrating a side view of another exemplary semiconductor device having one or more conductive floating gates superimposed on a conducting channel in accordance with the present invention.

In the embodiment illustrated in FIG. 11, the device comprises stacked upper and lower structures having conductive floating gates, the upper and lower structures being connected to different voltage supplies. Thus, as illustrated in FIG. 11, the lower structure includes a conductive floating gate 1101*a*, a barrier layer 1102*b*, a conducting channel 1103*a*, and a set of conductive floating gates 1104*a/b/c/d/e* superimposed on conducting channel 1103*a*; similarly, the upper structure includes a conductive floating gate 1101*b*, a barrier layer 1102*b*, and a conducting channel 1103*b*, and further includes a second barrier layer 1106 disposed on the upper surface of conducting channel 1103*b*, with a second set of conductive floating gates 1114*a/b/c/d/* superimposed on an upper surface of the second barrier layer 1106. Connecting to different voltage supplies allows for independent tuning and optimization and for the compensation of the effect of the voltage drop across the channel in each device.

Figure 12:
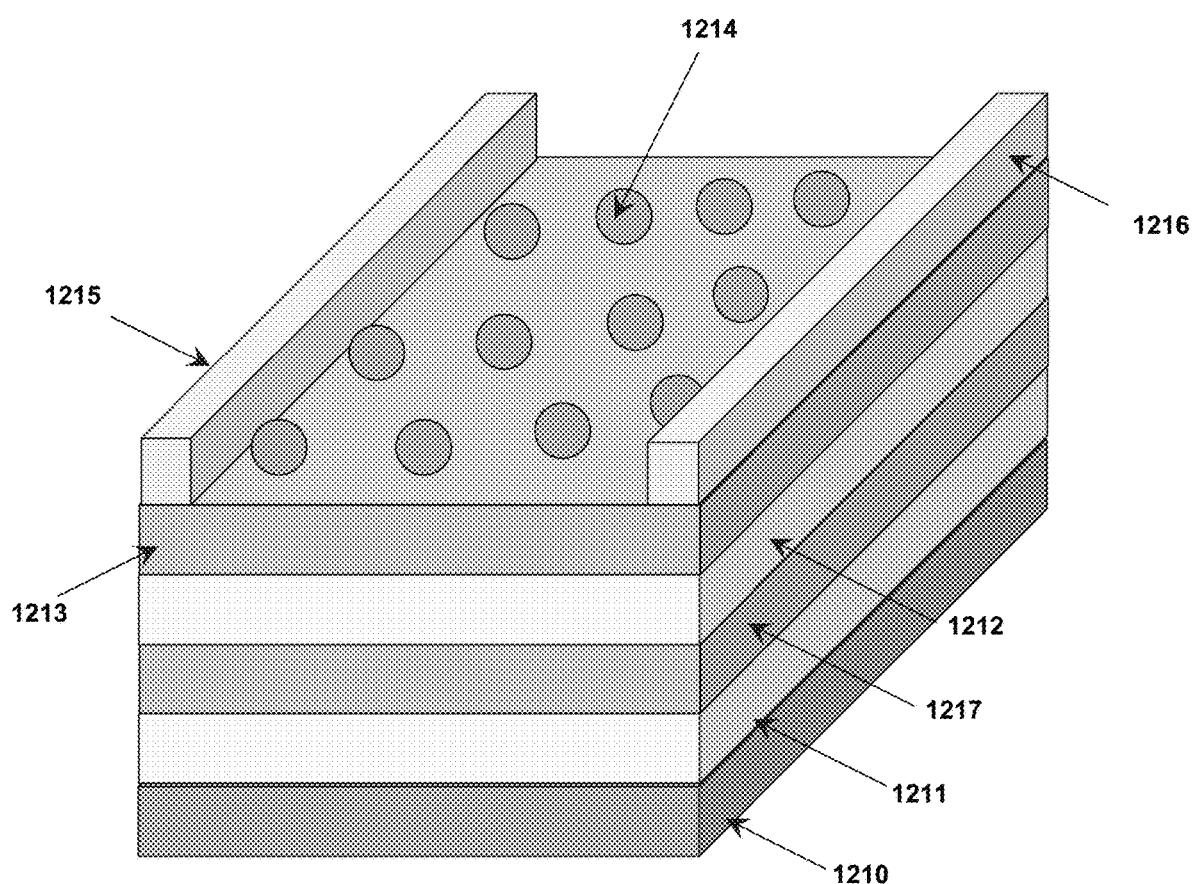
FIG. 12 is a block schematic illustrating aspects of another exemplary embodiment of a semiconductor device having one or more nanoparticle or nanocrystal conductive floating gates in accordance with the present invention.

In other embodiments, such as that illustrated in FIG. 12, the conductive floating gates can comprise an array of semiconductor nanoparticles or nanocrystals superimposed on an upper surface of the conducting channel and/or buried within the conducting channel. The nanoparticles on the surface of the channel are coupled capacitively to the two-dimensional electron fluid. The nanoparticles buried within the two-dimensional electron fluid form potential parries at the nanoparticle boundaries. Thus, as illustrated by the block schematic in FIG. 12, an exemplary device in accordance with this embodiment of the present invention includes Si or $SiO_2$ substrate 1210; a bottom conductive gate 1211; a $SiO_2$, AlN, epitaxial metal or highly doped poly-Si layer 1217; an insulating barrier layer 1212 made of a wider band gap material or a dielectric; a conducting channel 1213 that is formed by the two dimensional electronic fluid, such as those formed between heterojunctions of AlGaN and GaN or AlGaAs and InGaAs; and a plurality of nanoparticles 1214 such as n+ GaN nanoparticles or metal particles of carbon nanotubes superimposed on an upper surface of conducting channel 1213, with the device being coupled to source 1215 and drain 1216 electrodes.

As stated above, having an additional bottom gate for the compensation of the effect of the voltage drop across the channel. Using nanoparticles as the conductive floating gates in accordance with this embodiment of the present invention allows to induce the twisted plasmons in the structure, such as described in S. O. Potashin, V. Yu. Kachorovskii, and M. Shur, "Hydrodynamic Inverse Faraday Effect in Two Dimensional Electron Liquid," arXiv: 2001.08015v1 [cond-mat.mes-hall] 22 Jan. 2020.

Figure 13:
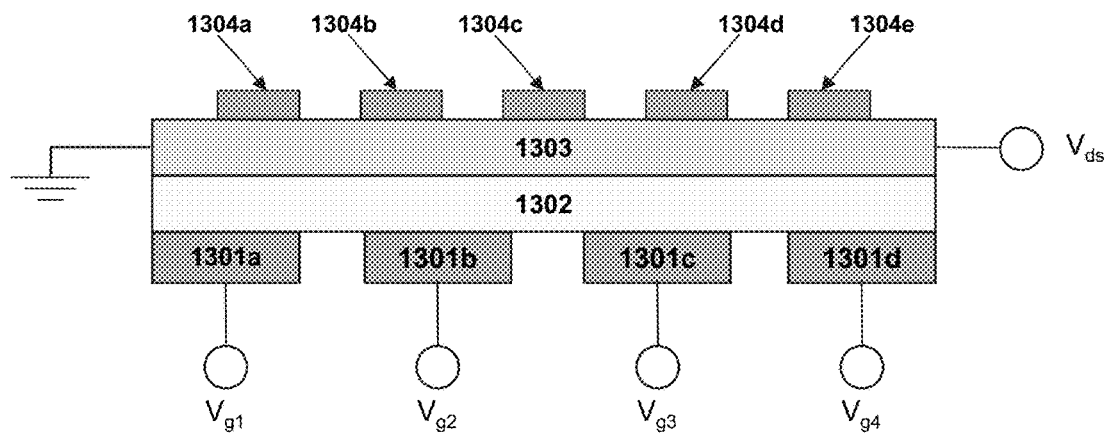
FIG. 13 is a block schematic illustrating aspects of another exemplary embodiment of a semiconductor device having one or more superconducting floating gates in accordance with the present invention.

FIG. 13 is a block schematic illustrating aspects of another exemplary embodiment of a semiconductor device having one or more conductive floating gates in accordance with the present invention, where the device includes more than one conductive floating gate that can be separately biased for individual tuning of each gate. Thus, a semiconductor device in accordance with this embodiment of the present invention includes conductive floating gates 1304a/b/c/d/e superimposed on an upper surface of conducting channel 1303, a barrier layer 1302 on a lower surface of the conducting channel, and further includes multiple conductive floating gates 1301a/b/c/d on a lower surface of barrier layer 1302, each of the conductive floating gates being coupled to a respective voltage source $V_{g1}$, $V_{g2}$, $V_{g3}$, $V_{g4}$. Such a configuration of conductive floating gates disposed on the barrier layer allows for synchronizing the plasma waves in the two-dimensional electronic fluid while the conductive floating gates control the wave vector and frequency of the plasma waves to tune the interaction with the impinging electromagnetic radiation.

Figure 14:
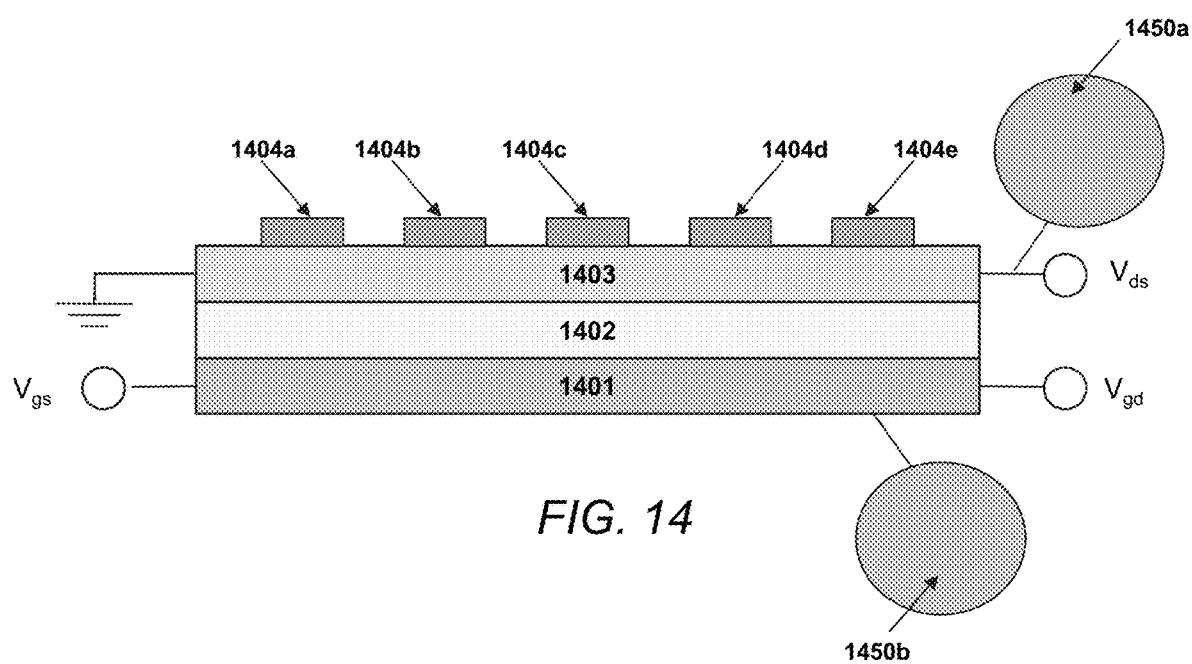
FIG. 14 is a block schematic illustrating aspects of another exemplary embodiment of a semiconductor device having one or more conductive floating gates in accordance with the present invention where the device includes one or more antennas for capturing or emitting THz or sub-THz radiation.

In another embodiment such as that illustrated by the block schematic in FIG. 14, a semiconductor device having one or more superconducting floating gates in accordance with the present invention can include one or more antennas for capturing or emitting THz or sub-THz radiation. Thus, as illustrated in FIG. 14, such a device can include a conductive floating gate 1401, a barrier layer 1402, conducting channel 1403, and conductive floating gates 1404a/b/c/d/e, and further includes antennas 1450a/b that electrically connected to the device contacts. These antennas collect the impinging electromagnetic radiation and connect to the device typically by transmission lines proving the effective voltage sources at the impinging radiation frequency.

The semiconductor devices of the present invention can enable the development of new sensitive THz detectors and powerful compact THz electronic sources. This is achieved by using new configurations of the conductive floating gates, using superconducting floating gates, incorporating such gates into the bulk of the semiconductor structure, using nanoparticles to create coupling structure to capture the electromagnetic radiation, by using cross-contact configuration to control the structure asymmetry by changing the current direction and using asymmetrical floating gates to break the structure symmetry for the effective rectification and conversion of the impinging electromagnetic radiation.

Figure 15:
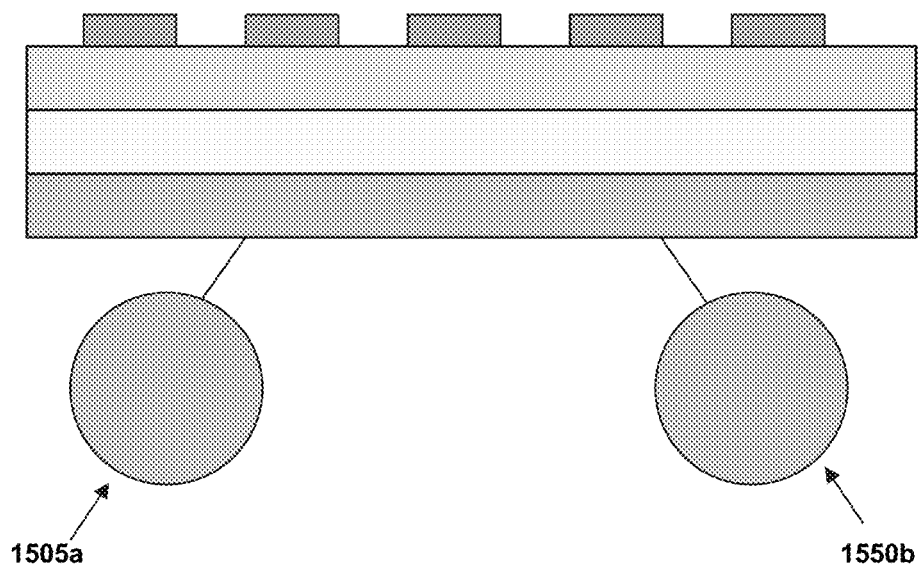
FIG. 15 is a block schematic illustrating aspects of another exemplary embodiment of a semiconductor device having one or more conductive floating gates in accordance with the present invention, where the device includes two antennas for capturing or emitting THz or sub-THz radiation connected to opposite sides of the device channel.
Figure 16:
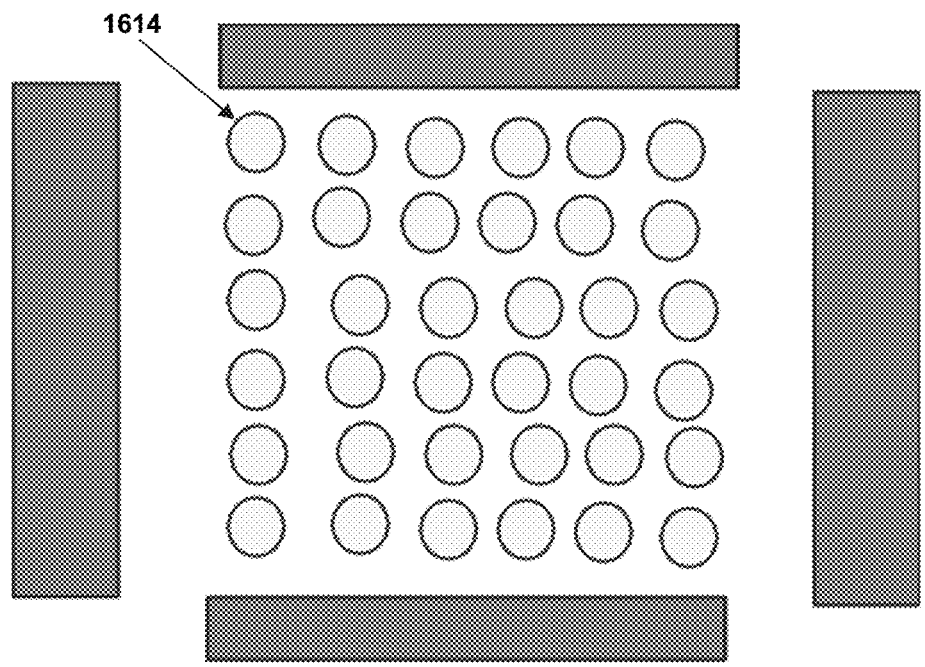
FIG. 16 is a block schematic illustrating aspects of another exemplary embodiment of a semiconductor device having one or more nanoparticle or nanocrystal conductive floating gates in accordance with the present invention and having cross contact configuration.
Figure 17:
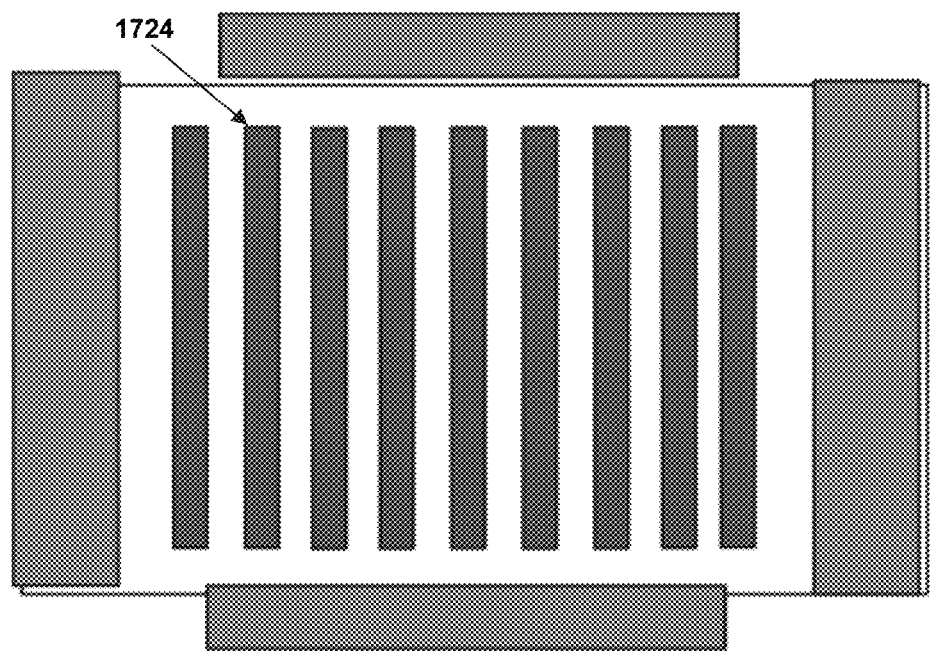
FIG. 17 is a block schematic illustrating aspects of another exemplary embodiment of a semiconductor device having rectangular conductive floating gates in accordance with the present invention and having cross contact configuration.

FIGS. 15-17 are block schematics illustrating additional exemplary embodiments of a semiconductor device having one or more conductive floating gates in accordance with the present invention.

The semiconductor device illustrated in FIG. 15 includes two antennas 1505a/1505 on the backside of the conductive floating gate (corresponding to conductive floating gates 1101, 1401 etc. described above) for capturing or emitting THz or sub-THz radiation connected to opposite sides of the device channel. The device illustrated in FIG. 16 includes one or more nanoparticle or nanocrystal floating gates 1614 in accordance with the present invention and having cross-contact configuration, while the device illustrated in FIG. 17 has rectangular floating gates 1724 and a cross-contact configuration.

The described devices allow for the new method of manipulating the electromagnetic radiation.

Figure 18:
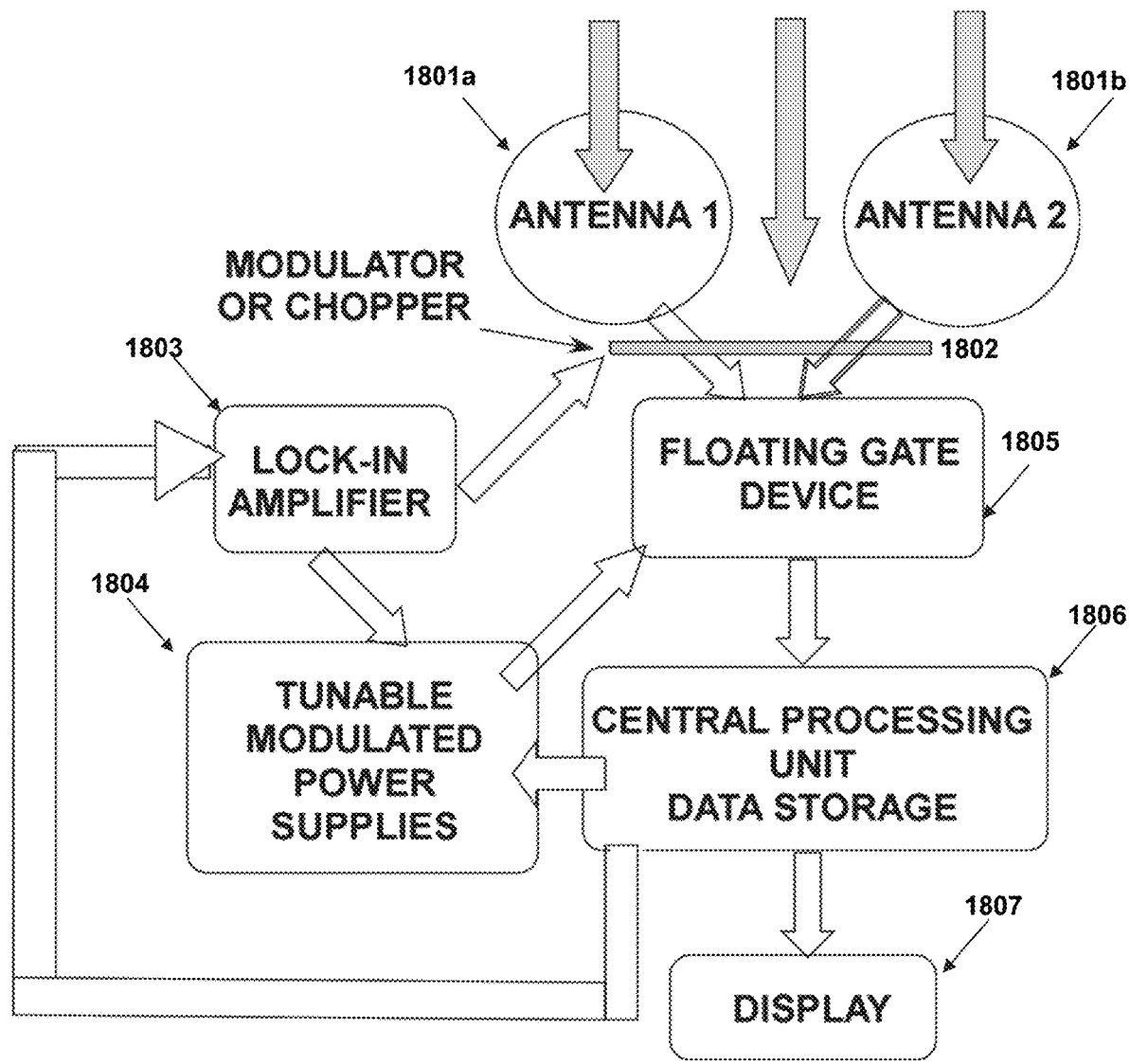
FIG. 18 is a block schematic illustrating aspects of another exemplary embodiment of a semiconductor device comprising a conductive floating gate device with two antennas.

FIG. 18 illustrates the manipulation method that comprises a conductive floating gate device 1805 with two antennas 1801a/1801b; modulator or chopper 1802 controlled by a lock-in amplifier 1803 that also controls modulated voltage supplies 1804 for biased gate and drain-to-source bias, both controlled by a central processing unit 1806 having an integrated data storage unit and having an optional display 1807. In one embodiment, the antennas have the same frequency sensitivity but shifted in phase (typically by 90 degrees). In this embodiment, the CPU determines the intensity, polarization, and direction of the impinging radiation by processing the response as a function of the bias voltages using the approach describes for a single conventional transistor in X. Liu, T. Ytterdal, and M. Shur, "Plasmonic FET Terahertz Spectrometer," *IEEE Access*, pp. 1-6, 2020.

In another embodiment, antenna 2 sensitivity peaks at the double frequency of the antenna 1, and the device doubles the radiation frequency which is emitted via antenna 2. In still another embodiment, antenna 1 is a radio frequency antenna supplying the RF radiation to the floating device, which is driven by the RF radiation to produce THz radiation, which is emitted by antenna 2 using the approach described for the plasmonic crystal with stubs in G. R. Aizin, J. Mikalopas, and M. Shur, "Current driven Dyakonov-Shur instability in ballistic nanostructures with a stub," *Phys. Rev. Applied*, 10, 064018 (2018).

This manipulation method could be generalize to use more antennas or antenna arrays and multiple floating gate devices.

Semiconductor devices incorporating conductive floating gates for the management of THz radiation have been described. Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A semiconductor device having a plurality of separated floating gates directly embedded within a conducting channel within the semiconductor device;
    wherein each one of the plurality of separated floating gates is spaced-apart from another one of the plurality of separated floating gates within the conducting channel;
    wherein each of the plurality of separated floating gates has a size smaller than a mean free path of electrons in the semiconductor device.

2. The semiconductor device according to claim 1, wherein the plurality of separated floating gates comprises a one- or two-dimensional periodic array of asymmetric structures.

3. The semiconductor device according to claim 1, wherein the plurality of separated floating gates comprises one or more concentric structures surrounding a central source.

4. The semiconductor device according to claim 1, wherein one or more additional floating gates are isolated front the conducting channel by a barrier layer, wherein the conducting channel is configured for managing electromagnetic radiation within the semiconductor device.

5. The semiconductor device according to claim 1, wherein at least one of the plurality of separated floating gates comprises $Nb_2N$, $Ta_2N$, $TaN_x$, $NbN_x$, $WN_x$, $MoN_x$, graphene, or a transition metal nitride ternary compound.

6. The semiconductor device according to claim 1, wherein at least one of the plurality of separated floating gates comprises semiconducting or metallic nanoparticles or nanocrystals.

7. The semiconductor device according to claim 1, wherein at least a portion of the plurality of separated floating gates is situated on a rear surface of a barrier layer in the semiconductor device, wherein each of the floating gates in the portion can be separately biased for individual tuning.

8. The semiconductor device according to claim 1, wherein the semiconductor device further includes at least one antenna attached to device contacts, wherein the at least one antenna is configured to manage THz or sub-THz radiation in the semiconductor device.

9. The semiconductor device according to claim 1, wherein the semiconductor device further includes at least one antenna attached to device contacts, wherein the at least one antenna is configured to manage radiation in the semiconductor device through an appropriate phase angle shift.

10. The semiconductor device according to claim 1, wherein at least one of the plurality of separated floating gates comprises superconducting material.

11. A method for managing electromagnetic waves in a semiconductor device, comprising:
providing a semiconductor device having a plurality of separated floating gates directly embedded within a conducting channel within the semiconductor device;
wherein each one of the plurality of separated floating gates is spaced-apart from another one of the plurality of separated floating gates within the conducting channel;
wherein each of the plurality of separated floating gates has a size smaller than a mean free path of electrons in the semiconductor device;
the method further comprising modulating, via the plurality of separated floating gates, properties of plasma waves in an electronic field of the semiconductor device.

12. The method for managing electromagnetic waves in a semiconductor device according to claim 11, wherein the plurality of separated floating gates comprises a one- or two-dimensional periodic array of asymmetric structures.

13. The method for managing electromagnetic waves in a semiconductor device according to claim 11, wherein the plurality of separated floating gates comprises one or more concentric structures surrounding a central source.

14. The method for managing electromagnetic waves in a semiconductor device according to claim 11, wherein one or more additional floating gates are isolated from the conducting channel by a barrier layer, wherein the conducting channel is configured for managing electromagnetic radiation within the semiconductor device.

15. The method for managing electromagnetic waves in a semiconductor device according to claim 11, wherein at least one of the plurality of separated floating gates comprises $Nb_2N$, $Ta_2N$, $TaN_x$, $NbN_x$, $WN_x$, $MoN_x$, graphene, or a transition metal nitride ternary compound.

16. The method for managing electromagnetic waves in a semiconductor device according to claim 11, wherein at, least one of the plurality of separated floating gates comprises semiconducting or metallic nanoparticles or nanocrystals.

17. The method for managing electromagnetic waves in a semiconductor device according to claim 11, wherein at least a portion of the plurality of separated floating gates is situated on a rear surface of a barrier layer in the semiconductor device, wherein each of the floating gates in the portion can be separately biased for individual tuning.

18. The method for managing electromagnetic waves in a semiconductor device according to claim 11, wherein the semiconductor device further includes at least one antenna attached to device contacts, wherein the at least one antenna is configured to manage THz or sub-THz radiation in the semiconductor device.

19. The method for managing electromagnetic waves in a semiconductor device according to claim 11, wherein the semiconductor device further includes at least one antenna attached to device contacts, wherein the at least one antenna is configured to manage radiation in the semiconductor device through an appropriate phase angle shift.

20. The method for managing electromagnetic waves in a semiconductor device according to claim 11, wherein at least one of the plurality of separated floating gates comprises superconducting material.

* * * * *